United States Patent
Kawanishi et al.

(10) Patent No.: US 6,579,363 B2
(45) Date of Patent: Jun. 17, 2003

(54) SEMICONDUCTOR SINGLE CRYSTAL PULLING APPARATUS

(75) Inventors: Souroku Kawanishi, Tochigi (JP); Masahito Watanabe, Tokyo (JP); Minoru Eguchi, Tokyo (JP)

(73) Assignees: Sumitomo Metal Industries, Ltd., Osaka (JP); NEC Corporation, Tokyo (JP)

( * ) Notice: Subject to any disclaimer, the term of this patent is extended or adjusted under 35 U.S.C. 154(b) by 0 days.

(21) Appl. No.: 09/978,206

(22) Filed: Oct. 17, 2001

(65) Prior Publication Data

US 2002/0073919 A1 Jun. 20, 2002

(30) Foreign Application Priority Data

Oct. 23, 2000 (JP) ........................................ 2000-322942

(51) Int. Cl.[7] .............................................. C30B 15/20
(52) U.S. Cl. ........................... 117/213; 117/29; 117/30; 117/32; 117/218; 117/917
(58) Field of Search ............................. 117/29, 30, 32, 117/211, 218, 918

(56) References Cited

U.S. PATENT DOCUMENTS

| | | | | |
|---|---|---|---|---|
| 4,592,895 A | * | 6/1986 | Matsutani et al. | 422/106 |
| 5,885,347 A | | 3/1999 | Tomioka et al. | 117/218 |
| 6,001,170 A | * | 12/1999 | Tomzig et al. | 117/32 |
| 6,077,346 A | * | 6/2000 | Watanabe et al. | 117/32 |
| 6,113,688 A | * | 9/2000 | Kawanishi et al. | 117/30 |
| 6,139,633 A | * | 10/2000 | Nishiura | 117/208 |
| 6,432,198 B2 | * | 8/2002 | Watanabe et al. | 117/29 |

FOREIGN PATENT DOCUMENTS

| | | |
|---|---|---|
| DE | 1004818 | 3/1957 |
| JP | 10-081581 | 3/1998 |
| JP | 11-171686 | 6/1999 |
| JP | 2000-063195 | 2/2000 |

* cited by examiner

*Primary Examiner*—Felisa Hiteshew
(74) *Attorney, Agent, or Firm*—Armstrong, Westerman & Hattori, LLP

(57) ABSTRACT

By using a semiconductor single crystal pulling apparatus for growing single crystals by the Czochralski method while rotating the melt by a magnetic field and electric current, namely by the EMCZ method, which comprises a main pulling means for pulling a single crystal, a holding mechanism for gripping an engaging stepped portion formed on the single crystal through engaging members and a sub pulling means for moving the holding mechanism up and down and in which an electric current is passed through the main pulling means and through the sub pulling means, it is possible to prevent heavy single crystals from undergoing a falling accident and, at the same time, effectively reduce the power consumption. In this pulling apparatus, it is effective to feed an electric current to the sub pulling means alone and it is desirable to dispose two or more electrodes whether the pulling means is of a shaft type or wire type.

14 Claims, 4 Drawing Sheets

SEMICONDUCTOR SINGLE CRYSTAL PULLING APPARATUS

FIELD OF THE INVENTION

This invention relates to a pulling apparatus for use in the production of semiconductor single crystals by a modification of the Czochralski method (hereinafter referred to as "CZ method" for short), namely the so-called electromagnetic CZ method (hereinafter referred to as "EMCZ method") according to which the CZ method is carried out while rotating the melt by applying a magnetic field thereto and passing an electric current therethrough, and more particularly, to a single crystal pulling apparatus which can prevent the single crystal from falling due to heat generation in the seed portion upon current supply and can reduce the electric power consumption.

DESCRIPTION OF THE PRIOR ART

The CZ method is a typical method of producing single crystals for semiconductors, such as silicon single crystals. The CZ method comprises bringing a seed crystal into contact with the melt surface of a crystal material contained in a crucible and then rotating the crucible and pulling the seed crystal while rotating the same in a direction opposite to the direction of rotation of the crucible to thereby allow the single crystal to grow. In producing single crystals by the CZ method, dislocations generally occur due to thermal shock given at the time the seed crystal is brought into contact with the melt. To prevent these dislocations from extending to the body of the single crystal, the so-called "Dash's neck process" is employed.

FIG. 1 is a schematic representation of the shape of the neck portion (hereinafter referred to as "Dash's neck") in the Dash's neck process. As shown in FIG. 1, the Dash's neck process in growing a single crystal comprises forming a Dash's neck 4 having a diameter of about 3 mm and a length of about 30 mm on top of the body of growing single crystal 9 so that the above-mentioned dislocations may not extend to the body of the single crystal.

In recent years, single crystals themselves, which are pulled up, have become larger and larger and heavier and heavier to cope with the demand for increased efficiency in the manufacture of semiconductors. However, such increases in size of single crystals have induced problems such as mentioned below under (1) to (3).

Thus, (1) with the increase in size of single crystals, the pulling apparatus itself, inclusive of the crucible, becomes larger. Then, (2) it becomes difficult to rotate the present large-sized crucible at a constant number of revolutions without eccentricity relative to the pulling axis throughout the whole single crystal pulling process. Further, (3) during the single crystal pulling operation, the neck portion may be damaged due to the increased weight and the single crystal may fall down.

For solving the problems (1) and (2) mentioned above, Japanese Patent Application Laid-Open No. H11-171686 and Japanese Patent Application Laid-Open No. 2000-63195 (an improvement to the former) propose the EMCZ method which is characterized in that a magnetic field is applied to the melt and a current is passed therethrough to generate the Lorentz force and thereby rotate the melt within the crucible. The EMCZ method proposed in these publications makes it possible to grow single crystals in a smaller-sized pulling apparatus as compared with the conventional CZ method in which the rotation of the crucible itself is mechanically controlled. Further, it is advantageous that the impurity distribution within single crystals can be made uniform.

However, since the EMCZ method requires as a prerequisite that an electric current be passed through the seed crystal and the single crystal body, an increased amount of Joule heat is generated in the smaller diameter portion of the Dash's neck, namely the portion indicated by a in FIG. 1, which shows a very high electric resistance. Due to this increased Joule heat generation, a local decrease in yield stress results. Thus, the single crystal pulling by the EMCZ method has the problem that, even when single crystals have a light weight, falling thereof tends to occur more readily as compared with the conventional CZ method.

Furthermore, as the electromagnetic force applied is increased, the rotation of the melt is disturbed and therefore the swing of the single crystal pulling axis increases. If the swing of the pulling axis increases, the single crystal may depart from the melt surface and it becomes difficult for the single crystal to grow steadily and stably. Furthermore, it becomes difficult to control the diameter of single crystal and, at the same time, further dislocations may occur, leading to decreases in the yield of grown single crystals and other problems.

In relation to the problem (3) mentioned above, the applicants have put into practical use a mechanism for preventing heavy single crystals from falling in the process of pulling by mechanically holding the engaging stepped portion having the form of an inverted cone and formed on top of the single crystal body (cf. Japanese Patent No. 2,990,658).

FIG. 2 is a schematic representation of the shape of a single crystal in applying the mechanical holding mechanism mentioned above. As shown in FIG. 2, for employing the above device in pulling single crystals, it is necessary to provide a large-diameter portion 5, an engaging stepped portion 6, a constricted portion 7 and a shoulder 8 between the Dash's neck 4 and the single crystal body 9. The mechanism described in the above-cited Japanese Patent No. 2,990,658 mechanically holds the above engaging stepped portion 6 and thus can prevent falling with the Dash's neck 4 as a starting point. This mechanism, however, is not intended for single crystal pulling by the EMCZ method, hence cannot solve the problems (1) and (2) mentioned above.

SUMMARY OF THE INVENTION

The present invention has been made in view of the problems mentioned above and it is an object of the invention to provide an apparatus by which even large-sized single crystals can be pulled safely, without allowing falling thereof, by inhibiting the local increase in electric resistance, namely the local increase in Joule heat, in single crystal pulling which is a problem intrinsic in the EMCZ method.

As a result of investigations concerning the problems of single crystal falling and the swing of the pulling axis in the EMCZ method mentioned above, the present inventors found that since, in growing single crystals by the EMCZ method, even a lightweight single crystal may fall during pulling, it is necessary to provide a mechanism for mechanically holding the single crystal and that shaft type pulling means for pulling single crystals is desirable for the prevention of single crystal swinging caused by the increased electromagnetic force.

It was further found that for reducing the local generation of Joule heat, it is effective to reduce the electric resistance of the Dash's neck and of the engaging stepped portion by providing the so-called bypass in addition to the ordinary power supply route, that the electric resistance in the system fed with electric power can be reduced by providing the bypass mentioned above and, as a result, the power consumption can be reduced and that since a large current can be passed through the system, a sufficient electromagnetic force can be secured for rotating the melt even when the magnetic field, which requires a considerable power consumption, is weakened.

The present invention has been completed based on the above findings and is directed to the single crystal pulling apparatus summarized below under (1) to (3):

(1) A single crystal pulling apparatus for use in growing single crystals by the CZ method while applying a magnetic field and electric current to or through the semiconductor melt which comprises a main pulling means for pulling a single crystal, a holding mechanism for gripping a constricted portion formed on the single crystal through engaging members and a sub pulling means for moving the holding mechanism up and down and is characterized in that an electric current is passed through the main pulling means and through the sub pulling means (hereinafter, "first apparatus").

(2) A single crystal pulling apparatus as defined above under (1) which is characterized in that after holding of the engaging stepped portion by the engaging members, the electric current through the main pulling means is shut off and an electric current is passed through the sub pulling means alone (hereinafter, "second apparatus").

(3) A single crystal pulling apparatus as defined above under (1) or (2) which is characterized in that the single crystal pulling means is of a shaft type (hereinafter, "third apparatus").

DESCRIPTION OF PREFERRED EMBODIMENTS

Figure 3:
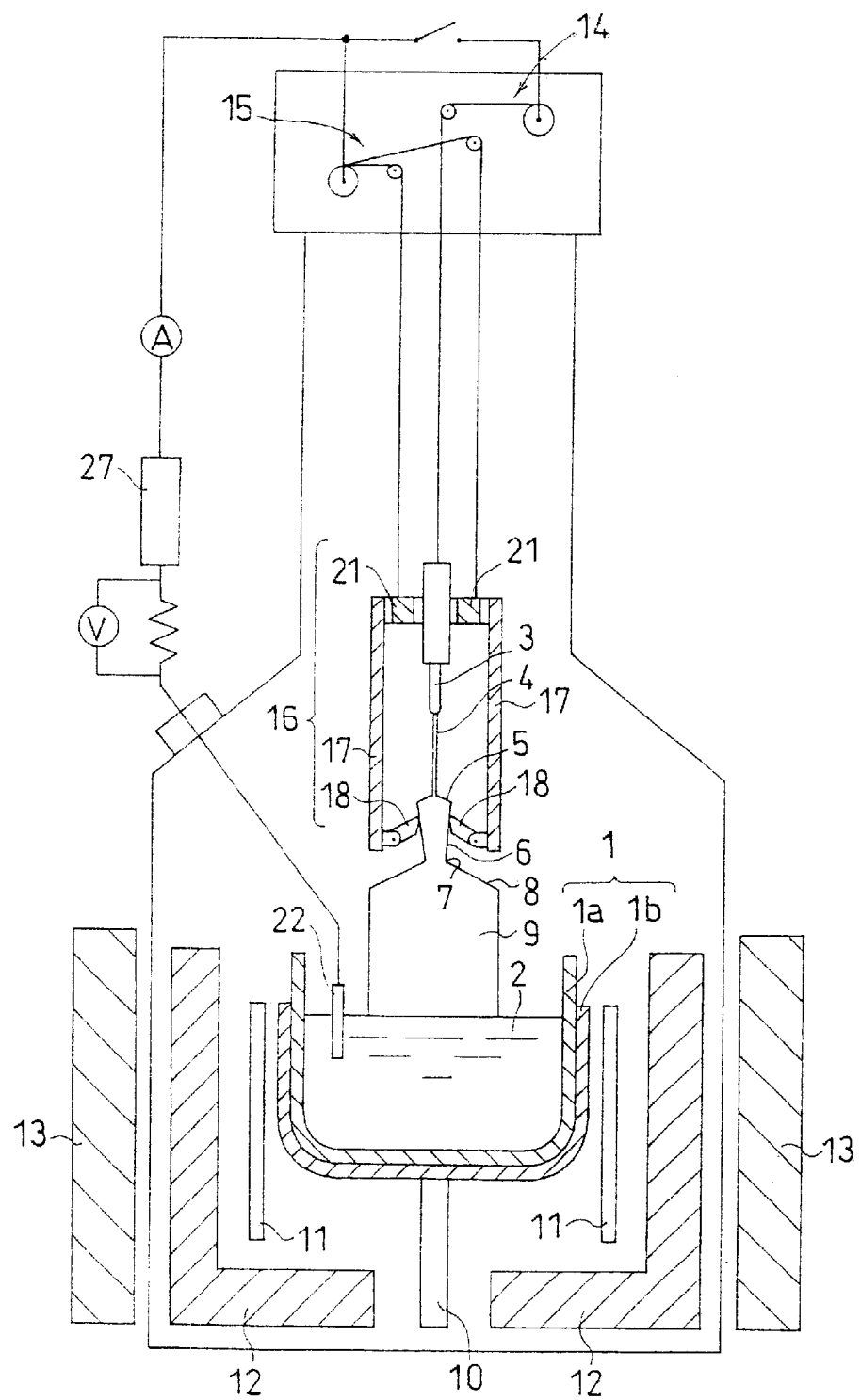
FIG. 3 is an illustration of the constitution of the apparatus of the invention in which the single crystal pulling means is of a wire type.
Figure 4:
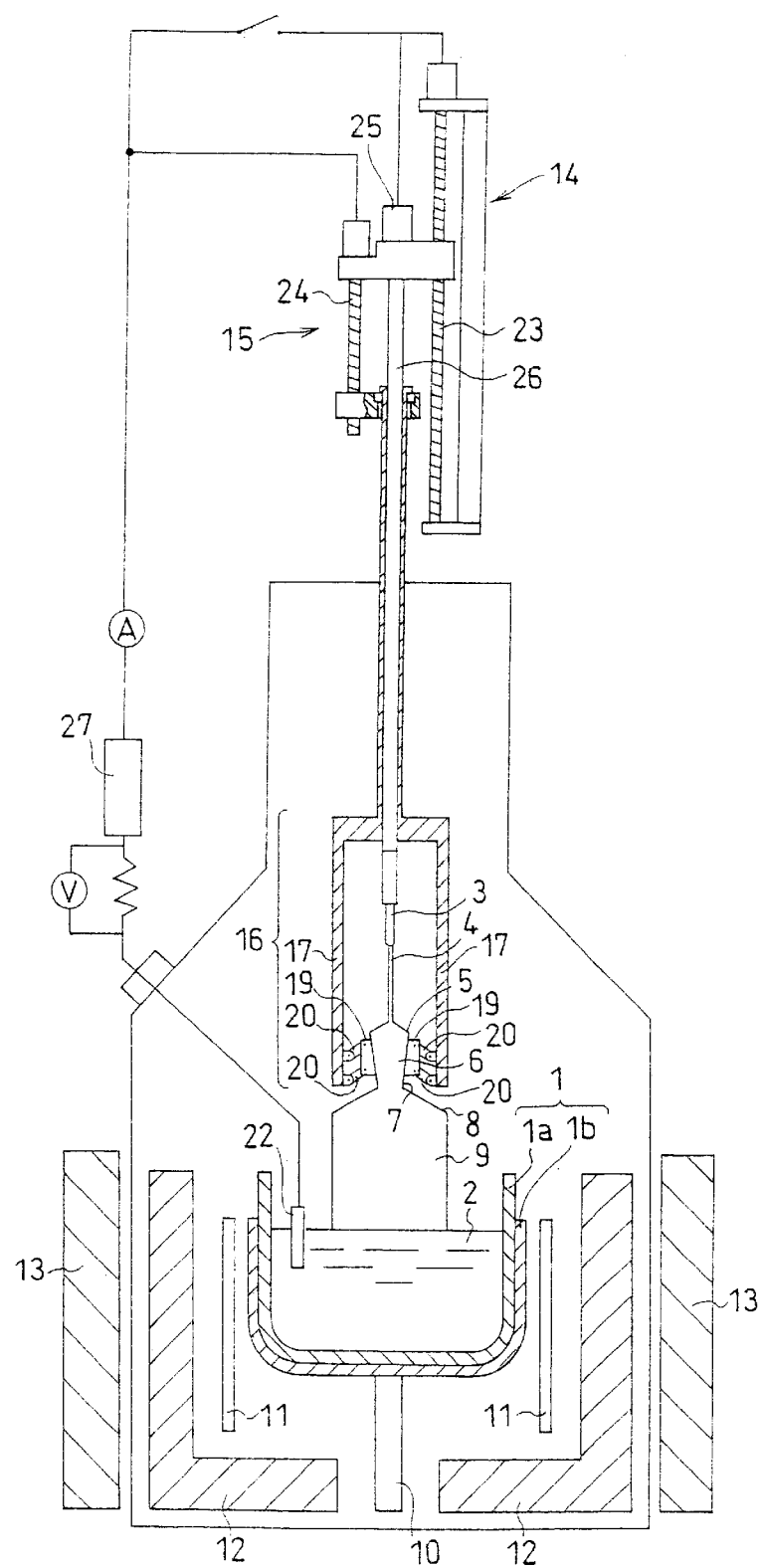
FIG. 4 is an illustration of the constitution of the apparatus of the invention in which the single crystal pulling means is of a shaft type.

FIG. 3 and FIG. 4 illustrate the constitutions of the apparatus according to the present invention. In the single crystal pulling apparatus shown in FIG. 3, the single crystal pulling means is of a wire type and, in the single crystal pulling apparatus shown in FIG. 4, the single crystal pulling means is of a shaft type. In both figures, those constituent members having the same function are given the same numbers.

Referring to FIG. 3 and FIG. 4, the constitution and features of the apparatus of the invention are now described.

1. Constitution of the apparatus of the invention

Figure 1:
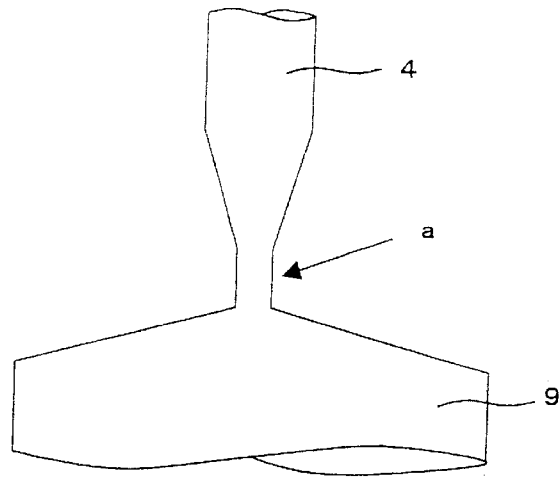
FIG. 1 is a schematic representation of the ordinary shape of a Dash's neck.
Figure 2:
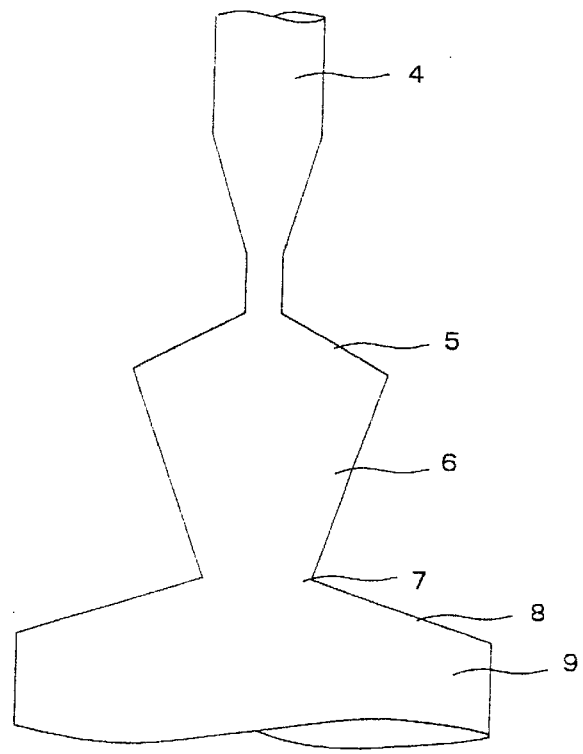
FIG. 2 is a schematic representation of the shape of a single crystal in applying a mechanical holding mechanism.

In the single crystal pulling apparatus according to the invention, a seed crystal 3 is brought into contact with a melt 2 filled in a crucible 1 constituted of a quartz crucible 1a and graphite crucible 1b and a single crystal body 9 is grown while pulling the seed crystal 3. More particularly, after bringing the seed crystal 3 into contact with the surface of the melt 2 by means of a main pulling means 14 and, while rotating the seed crystal, the seed crystal 3 is then pulled to form a Dash's neck 4, as shown in FIG. 2, then a large-diameter portion 5, an engaging stepped portion 6, a constricted portion 7 and a single crystal shoulder 8. Thereafter, the single crystal body 9 is pulled while rotating.

The crucible 1 is supported by a crucible-supporting shaft 10. Around the crucible 1, there are disposed a heater 11 for heating the melt 2 and a thermal insulator 12. Further, around the thermal insulator 12, there is disposed a device for magnetic field application device 13 for generating a cusped or longitudinal magnetic field.

A magnetic field is applied to the melt 2 in the direction perpendicular to the crystal growth interface by means of the device of magnetic field application device 13. Further, an electric current is passed through the melt in the direction perpendicular to the magnetic field. The melt 2 is thus rotated by the Lorentz force in the direction opposite to the direction of rotation of the single crystal body 9 mentioned above.

After the single crystal body 9 has been pulled up to a certain extent, a holding mechanism 16 is moved down by a sub pulling means 15. On that occasion, clamp levers 18, or clamp catches 19 and link levers 20, mounted on engaging members 17, in an inverted conical state pushed up and opened by the engaging stepped portion 6, allow the passage of the large-diameter portion. After the passage of the large-diameter portion 5, the engaging members 17 hold the engaging stepped portion 6. After completion of the gripping of the engaging members 17, the main pulling means 14 and sub pulling means 15 pull the single crystal in synchronization with each other. An equalizer 21 is disposed on top of the holding mechanism and this equalizer 21 can prevent the single crystal body 9 from tilting during pulling up.

An electrode 22 is in the melt 2 and the other electrode is connected with the main pulling means 14 and sub pulling means 15. Therefore, before holding of the engaging stepped portion 6 by the engaging members 17, that is, while the engaging stepped portion 6 is apart from the engaging members 17, the main pulling means 14 alone is fed with an electric current and the Joule heat generation locally increases in the Dash's neck 4 and engaging stepped portion 6.

2. First apparatus

When the first apparatus is used, the heat generation in the Dash's neck 4 and engaging stepped portion 6 can be suppressed since, after holding of the engaging stepped portion 6 by the engaging members 17, an electric current runs also from the engaging members 17 through the engaging stepped portion 6 via the sub pulling means 15. Since not only the main pulling means 14 but also the sub pulling means 15 is utilized as a passage for power supply, the electric resistance of the whole system can be reduced, hence the power consumption can be reduced.

3. Second apparatus

When the second apparatus is used, the current supply to the main pulling means 14 is discontinued when the engaging stepped portion 6 comes into contact with the engaging members 17, and an electric current is fed to the sub pulling means alone, so that it is possible to avoid the heat generation in the Dash's neck 4 and suppress the heat generation in the engaging stepped portion 6. Further, since the electric resistance of the sub pulling means 15 is smaller as compared with the main pulling means 14, the power consumption can be reduced.

4. Third apparatus

The "pulling means of a shaft type" so referred to in relation to the third apparatus has a structure such that, as shown in FIG. 4, the main pulling means 14 and sub pulling means 15 can be moved up and down independently by the turning operation of a main ball screw 23 and by the turning operation of a sub ball screw 24, respectively. The seed crystal is held by a shaft 26 disposed under a crystal-rotating motor 25. By this constitution, it is possible to prevent the pulling axis of the single crystal body 9 from swinging even when the rotation of the melt 2 is disturbed by application of a great electromagnetic force, to prevent the single crystal body 9 from departing from the melt surface as otherwise resulting from increased swinging, to thus stabilize the diameter control and further to prevent the single crystal body 9 from dislocations. Each pulling means is connected with a conductor from a power source 27 and the main pulling means 14 and sub pulling means 15 can be utilized also as passages for power supply.

The above-mentioned disturbance in the rotation of the melt 2 can be reduced by disposing a plurality of electrodes 22 at equal spaces around the single crystal body 9.

Figure 5A:
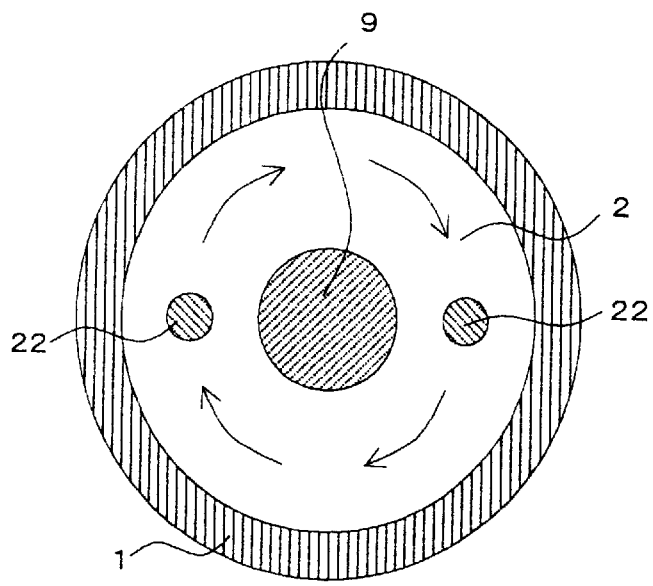
In FIG. 5A, two electrodes are disposed and, in FIG. 5B, three electrodes are disposed.
Figure 5B:
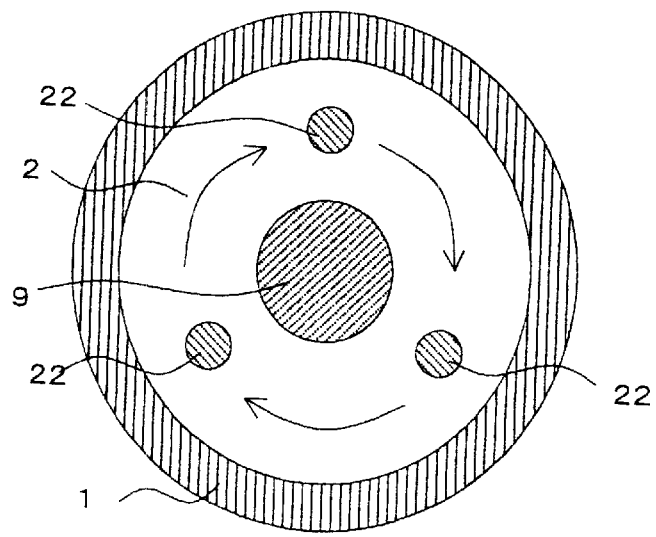
FIG. 5 is an illustration of how to dispose a plurality of electrodes in the single crystal pulling apparatus for carrying out the EMCZ method.

FIG. 5 shows typical states of disposition of a plurality of electrodes in the single crystal pulling apparatus for the EMCZ method as observed in perpendicular to the pulling axis. FIG. 5A shows the state of disposition of two electrodes and FIG. 5B shows the state of disposition of three electrodes. As shown in FIG. 5A or B, two or three electrodes are disposed at equal spaces on one and the same circle with the single crystal body 9 as the center. By disposing electrodes 22 in such positions, it is possible to reduce the disturbance of rotation of the melt 2, so that even when the single crystal pulling apparatus used employs wire type pulling means, the swinging of the pulling axis hardly occurs during pulling the single crystal body 9.

EXAMPLES

The effects of the present invention are explained based on the following specific examples 1 and 2.

Example 1

Using the wire type pulling apparatus shown in FIG. 3, silicon single crystal growing tests were carried out after formation of a Dash's neck having a diameter of 3 to 3.5 mm. The diameter of single crystal was 305 mm and its length was 1,000 mm. The conditions of pulling as found are shown in Table 1. In this example, the crucible was charged with 300 kg of silicon material and the electromagnetic force was 1 A·T (magnetic field strength; 01 T, current: 10 A). In Examples 1 and 2 of the invention and Comparative Example 2, when the weight of single crystal became 60 kg, the engaging stepped portion 6 was held by the engaging members 16 and the single crystal pulling was continued. The electric resistance, power consumption and Dash's neck diameter as found in each example are shown in Table 2.

TABLE 2

| Item | Mean electric resistance (Ω) | Mean power consumption (kW) | Mean Dash's neck diameter (mm) |
|---|---|---|---|
| Example of Invention 1 | 8.6 | 0.86 | 3.2 |
| Example of Invention 2 | 5.5 | 0.55 | 3.1 |
| Comparative Example 1 | 72 | 7.2 | 3.2 |
| Comparative Example 2 | 72 | 7.2 | 3.2 |

As shown in Table 1, the single crystal began to fall in Comparative Example 1 when its weight became 70 kg. In Examples 1 and 2 of the Invention and Comparative Example 2, no single crystals fell. In Comparative Example 2, however, no improvement was achieved in the heat generation in the engaging stepped portion and thus some apprehensions were entertained of falling of the single crystal due to a decrease in yield stress and of influences on the single crystal body in case of cracking in the engaging stepped portion.

Further, in Comparative Examples 1 and 2, the electric resistance of the whole system was high and the power consumption could not be reduced, as shown in Table 2. In Examples 1 and 2 of the Invention, on the contrary, almost no heat generation occurred in the engaging stepped portion. In the examples of the invention, the electric resistance was almost half as compared with the comparative examples; the power consumption was thus reduced.

Example 2

Using the wire type pulling apparatus shown in FIG. 3 and the shaft type pulling apparatus shown in FIG. 4, silicon single crystal growing tests were carried out after formation of a Dash's neck having a diameter of 3 to 3.5 mm. The diameter of single crystal was 305 mm and its length was 1,000 mm. The results are shown in Table 3. In these tests, the crucible was charged with 300 kg of silicon material and the electromagnetic force was 0.3 to 1.5 A·T. In cases where the number of electrodes was 2, the electrodes were disposed as shown in FIG. 5A.

TABLE 1

| | | Sites of current feeding | | Conditions of single crystal pulling in different weight ranges (numbers*) | | | | |
|---|---|---|---|---|---|---|---|---|
| Item | Holding mechanism | Main | Sub | 60–69 kg | 70–79 kg | 80–89 kg | 90–99 kg | 100 kg- |
| Example of Invention 1 | Yes | — | ○ | 0/20 | 0/20 | 0/20 | 0/20 | 0/20 |
| Example of Invention 2 | Yes | ○ | ○ | 0/20 | 0/20 | 0/20 | 0/20 | 0/20 |
| Comparative Example 1 | Yes | ○ | — | 0/20 | 2/20 | 2/20 | 5/20 | 11/20 |
| Comparative Example 2 | Yes | ○ | — | 0/20 | 0/20 | 0/20 | 0/20 | 0/20 |

*The numbers in the table indicate (number of fallen crystals/number of crystals pulled up).

TABLE 3

| Item | Holding mechanism | Sites of current feeding Main | Sites of current feeding Sub | Number of electrodes | Type of pulling means | Electromagnetic force (A·T) | Range of crystal swinging (mm) |
|---|---|---|---|---|---|---|---|
| Example of Invention 3 | Yes | ○ | ○ | 1 | Wire type | 0.3 | 0 |
| Example of Invention 4 | Yes | ○ | ○ | 1 | Wire type | 0.5 | 5 |
| Example of Invention 5 | Yes | ○ | ○ | 1 | Wire type | 1.5 | 30 |
| Example of Invention 6 | Yes | ○ | ○ | 1 | Shaft type | ≧0.5 | 0 |
| Example of Invention 7 | Yes | ○ | ○ | 2 | Wire type | 0.3 | 0 |
| Example of Invention 8 | Yes | ○ | ○ | 2 | Wire type | 0.5 | 0 |
| Example of Invention 9 | Yes | ○ | ○ | 2 | Wire type | 1.5 | 2 |

In Examples 3 to 5 of the Invention, in which the pulling means was of a wire type and one electrode alone was disposed, the single crystal began to swing at an electromagnetic force of about 0.5 A·T, as shown in Table 3. This is because the melt rotates concentrically with the pulling axis as the center at an electromagnetic force of about 0.3 A·T but the rotation of the melt begins to be disturbed from at about 0.5 A·T. On the contrary, in Example 6 of the Invention, in which the pulling means was of a shaft type, the pulling axis did not swing even at 0.5 A·T and above, irrespective of the disturbance in the rotation of the melt.

In Examples 7 to 9 of the Invention, in which two electrodes were disposed although the pulling means was of a wire type, almost no disturbance was observed in the rotation of the melt and no swing of single crystal occurred until an electromagnetic force of 1.5 A·T. Therefore, when two or more electrodes are disposed at equal spaces, the wire type can satisfactorily work even when an electromagnetic force of below 1.5 A·T is applied.

As described hereinabove, when single crystals are pulled by the EMCZ method using the apparatus of the present invention, the local decrease in yield stress due to the Joule heat generation, which is intrinsic in the EMCZ method, can be suppressed and even heavy single crystals can be produced safely without occurrence of any falling accident. The electric resistance of the system as a whole can be reduced, hence the power consumption can be reduced.

What is claimed is:

1. A single crystal pulling apparatus for use in growing single crystals by the Czochralski method while applying a magnetic field and electric current to or through the semiconductor melt which comprises
   a main pulling means for pulling a single crystal,
   a holding mechanism for gripping an engaging stepped portion formed on the single crystal through engaging members,
   a sub pulling means for moving the holding mechanism up and down, and
   a means for feeding an electric current to said main pulling means and sub pulling means.

2. A single crystal pulling apparatus as claimed in claim 1, wherein, after holding of the engaging stepped portion by the engaging members, the electric current through said main pulling means is shut off and an electric current is passed through said sub pulling means alone.

3. A single crystal pulling apparatus as claimed in claim 2, wherein a plurality of electrodes are available for application to the melt and the electrodes are disposed in a state immersed in the melt layer in an axially symmetrical manner relative to the pulling axis.

4. A single crystal pulling apparatus as claimed in claim 2, wherein the single crystal pulling apparatus is a shaft pulling apparatus.

5. A single crystal pulling apparatus as claimed in claim 2, wherein the single crystal to be pulled has a weight of not less than 300 kg.

6. A single crystal pulling apparatus as claimed in claim 2, wherein the electromagnetic force applied is 0.3 to 1.5 A·T.

7. A single crystal pulling apparatus as claimed in claim 1, wherein a plurality of electrodes are available for application to the melt and the electrodes are disposed in a state immersed in the melt layer in an axially symmetrical manner relative to the pulling axis.

8. A single crystal pulling apparatus as claimed in claim 7, wherein the single crystal to be pulled has a weight of not less than 300 kg.

9. A single crystal pulling apparatus as claimed in claim 7, wherein the electromagnetic force applied is 0.3 to 1.5 A·T.

10. A single crystal pulling apparatus as claimed in claim 1, wherein the single crystal pulling apparatus is a shaft pulling apparatus.

11. A single crystal pulling apparatus as claimed in claim 10, wherein the single crystal to be pulled has a weight of not less than 300 kg.

12. A single crystal pulling apparatus as claimed in claim 10, wherein the electromagnetic force applied is 0.3 to 1.5 A·T.

13. A single crystal pulling apparatus as claimed in claim 1, wherein the single crystal to be pulled has a weight of not less than 300 kg.

14. A single crystal pulling apparatus as claimed in claim 1, wherein the electromagnetic force applied is 0.3 to 1.5 A·T.

* * * * *

UNITED STATES PATENT AND TRADEMARK OFFICE
CERTIFICATE OF CORRECTION

PATENT NO. : 6,579,363 B2
DATED : June 17, 2003
INVENTOR(S) : Kawanishi et al.

It is certified that error appears in the above-identified patent and that said Letters Patent is hereby corrected as shown below:

<u>Title page,</u>
Item [73], Assignee, change "Sumitomo Metal Industries, Ltd., Osaka (JP)" to
-- Sumitomo Mitsubishi Silicon Corportion, Tokyo (JP) --.

Signed and Sealed this

Twenty-eighth Day of October, 2003

JAMES E. ROGAN
*Director of the United States Patent and Trademark Office*